(12) United States Patent
Shao et al.

(10) Patent No.: US 12,382,627 B2
(45) Date of Patent: Aug. 5, 2025

(54) SEMICONDUCTOR STRUCTURE AND FORMING METHOD THEREOF

(71) Applicant: CHANGXIN MEMORY TECHNOLOGIES, INC., Hefei (CN)

(72) Inventors: Guangsu Shao, Hefei (CN); Deyuan Xiao, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 481 days.

(21) Appl. No.: 17/934,679

(22) Filed: Sep. 23, 2022

(65) Prior Publication Data
US 2024/0023317 A1 Jan. 18, 2024

(30) Foreign Application Priority Data
Jul. 15, 2022 (CN) .................. 202210832052.X

(51) Int. Cl.
*H10B 12/00* (2023.01)
(52) U.S. Cl.
CPC .......... *H10B 12/482* (2023.02); *H10B 12/05* (2023.02); *H10B 12/315* (2023.02)

(58) Field of Classification Search
None
See application file for complete search history.

(56) References Cited

U.S. PATENT DOCUMENTS 8,293,604 B2 * 10/2012 Yoon .................. H10B 69/00
438/270
2020/0083225 A1 * 3/2020 Ma .................. G11C 11/401

\* cited by examiner

*Primary Examiner* — Steven M Page
(74) *Attorney, Agent, or Firm* — Kilpatrick Townsend & Stockton LLP

(57) ABSTRACT

The present disclosure discloses a semiconductor structure and a forming method thereof. The forming method includes: providing a base, where the base is provided with a plurality of bit line isolation trenches extending along a first direction and an isolation structure located in the bit line isolation trench; performing a patterned etching on the base to form a plurality of word line isolation trenches extending along a second direction, where the plurality of bit line isolation trenches and the plurality of word line isolation trenches form a plurality of semiconductor pillars in the base; forming a bit line metal layer on a surface of the semiconductor pillar under the word line isolation trenches, where the bit line metal layer surrounds a sidewall of the semiconductor pillar.

12 Claims, 10 Drawing Sheets

SEMICONDUCTOR STRUCTURE AND FORMING METHOD THEREOF

CROSS-REFERENCE TO RELATED APPLICATION

This disclosure claims the priority of Chinese Patent Application No. 202210832052.X submitted to the Chinese Intellectual Property Office on Jul. 15, 2022, the disclosure of which is incorporated herein in its entirety by reference.

TECHNICAL FIELD

The present disclosure relates to the technical field of pressure sensors, and in particular to a semiconductor structure and a forming method thereof.

BACKGROUND

In the related art, during the preparation of a semiconductor structure, a word line structure is usually formed by a self-aligned double patterning (SADP) or self-aligned quadruple patterning (SAQP) process, which requires a new photomask to form a self-aligned word line metal layer and word line isolation layer. The process is complex and costly, and the new photom ask also tends to affect the overlay accuracy.

SUMMARY

The forming method of a semiconductor structure according to an embodiment of the present disclosure includes: providing a base, where the base is provided with a plurality of bit line isolation trenches extending along a first direction and an isolation structure located in the bit line isolation trench; performing a patterned etching on the base to form a plurality of word line isolation trenches extending along a second direction, where the plurality of bit line isolation trenches and the plurality of word line isolation trenches form a plurality of semiconductor pillars in the base; and forming a bit line metal layer on a surface of the semiconductor pillar under the word line isolation trench, the bit line metal layer surrounding a sidewall of the semiconductor pillar.

The semiconductor structure according to an embodiment of the present disclosure includes: a base, where the base is provided with a plurality of bit line isolation trenches extending along a first direction, an isolation structure located in the bit line isolation trench, and a plurality of word line isolation trenches extending along a second direction, and the plurality of bit line isolation trenches and the plurality of word line isolation trenches form a plurality of semiconductor pillars in the base; and bit line metal layers, where the bit line metal layer is located on a surface of the semiconductor pillar under the word line isolation trench, and the bit line metal layer surrounds a sidewall of the semiconductor pillar.

DETAILED DESCRIPTION

A forming method of a semiconductor structure 100 provided in the present disclosure is described in further detail below with reference to the accompanying drawings and specific implementations.

The forming method of a semiconductor structure 100 according to an embodiment of the present disclosure is described below with reference to the accompanying drawings.

Figure 19:
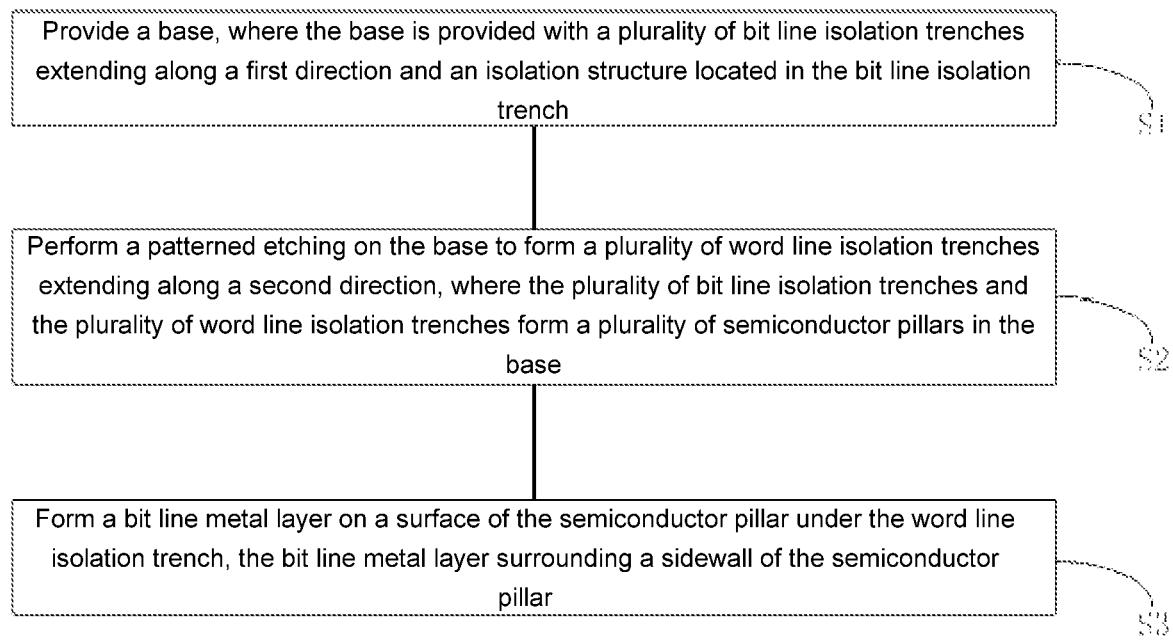
FIG. 19 is a flowchart of a forming method of a semiconductor structure according to an embodiment of the present disclosure.

As shown in FIG. 19, the forming method of a semiconductor structure 100 according to an embodiment of the present disclosure may include: S1: providing a base 1, where the base 1 is provided with a plurality of bit line isolation trenches 12 extending along a first direction and an isolation structure 13 located in the bit line isolation trench 12; S2: performing a patterned etching on the base 1 to form a plurality of word line isolation trenches 41 extending along a second direction, where the plurality of bit line isolation trenches 12 and the plurality of word line isolation trenches 41 form a plurality of semiconductor pillars 33 in the base 1; and S3: forming a bit line metal layer 32 on a surface of the semiconductor pillar 33 under the word line isolation trenches 41, the bit line metal layer 32 surrounding a sidewall of the semiconductor pillar 33.

Figure 1:
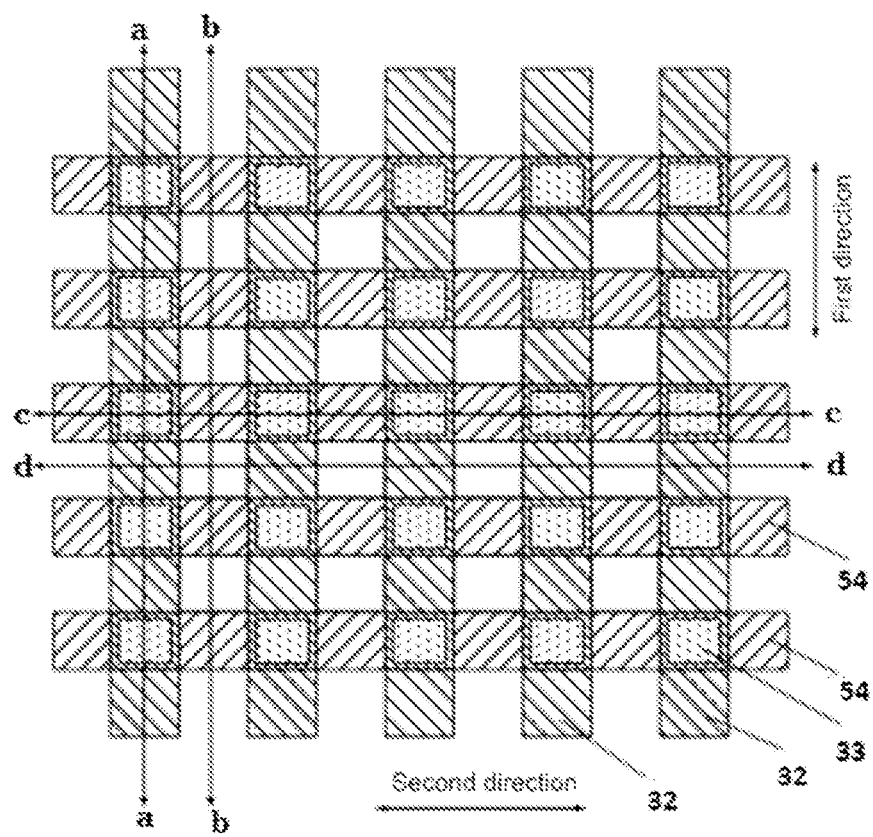
FIG. 1 is a schematic structural diagram of a semiconductor structure according to an embodiment of the present disclosure.

FIG. 1 is a schematic structural top view of a semiconductor structure 100 according to an embodiment of the present disclosure; FIG. 2 to FIG. 18 are cross-sectional views corresponding to various steps of a forming method of a semiconductor structure 100 taken along line a-a, line b-b, line c-c, and line d-d according to an embodiment of the present disclosure. The forming method of a semiconductor structure 100 according to an embodiment of the present disclosure is described below with reference to FIG. 1 to FIG. 19. The forming method of a semiconductor structure 100 according to the embodiment of the present disclosure includes the following steps:

With reference to FIG. 1 to FIG. 4, step S1: Provide a base 1, where the base 1 is provided with a plurality of bit line isolation trenches 12 extending along a first direction and an isolation structure 13 located in the bit line isolation trench 12.

Specifically, in some embodiment, the step of forming a base 1 may include: providing a substrate 11.

Specifically, the substrate 11 may be, but is not limited to, a silicon substrate. This specific implementation is described by taking the substrate 11 being a silicon substrate for example. In other embodiments, the substrate 11 may alternatively be a semiconductor substrate 11 such as a gallium nitride substrate, a gallium arsenide substrate, a gallium carbide substrate, a silicon carbide substrate or an SOI substrate. The substrate 11 is configured to support device structures thereon.

Figure 2:
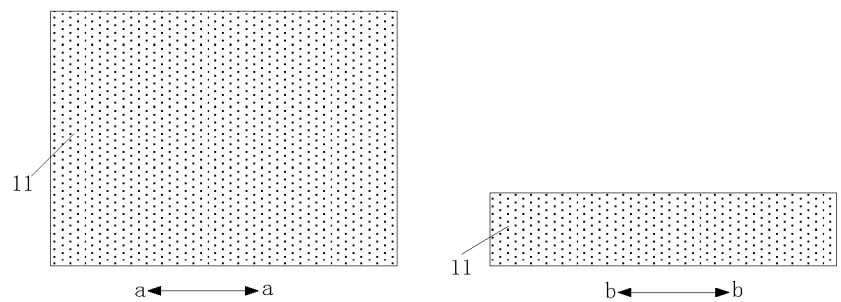
FIG. 2 to FIG. 18 are cross-sectional views corresponding to various steps of a forming method of a semiconductor structure according to an embodiment of the present disclosure, where a-a is a cross-sectional view taken along a-a in FIG. 1, b-b is a cross-sectional view taken along b-b in FIG. 1, c-c is a cross-sectional view taken along c-c in FIG. 1, and d-d is a cross-sectional view taken along d-d in FIG. 1.
Figure 2:
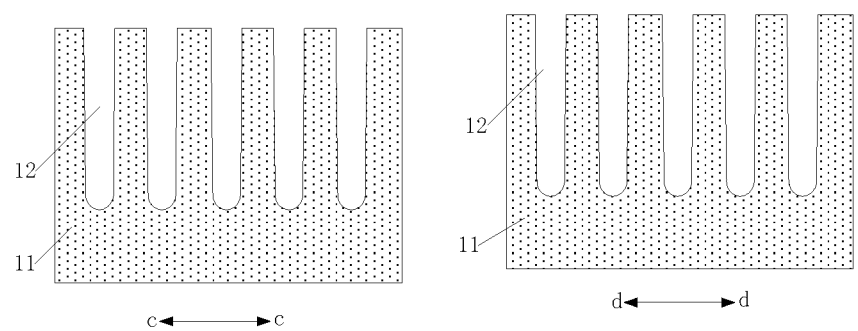
Figure 3:
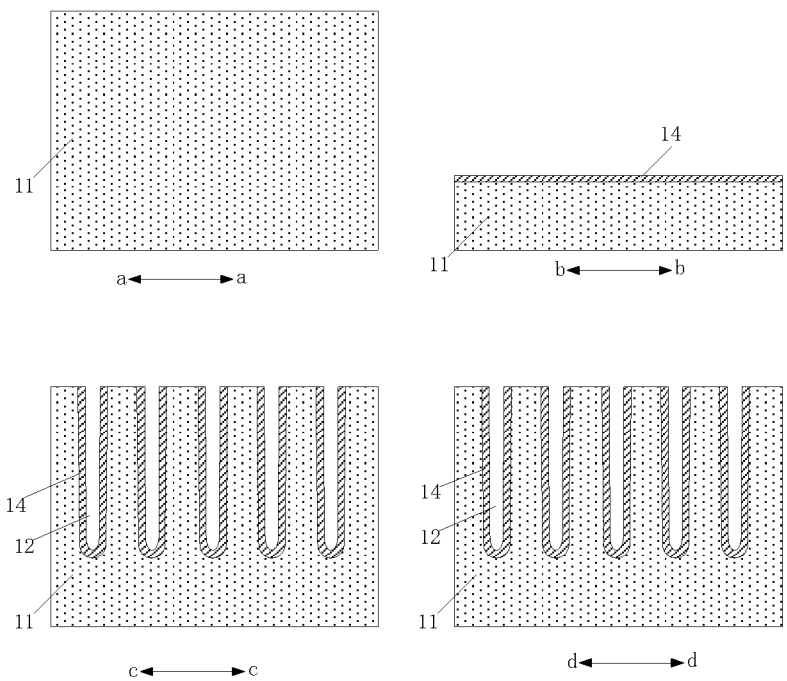
Figure 4:
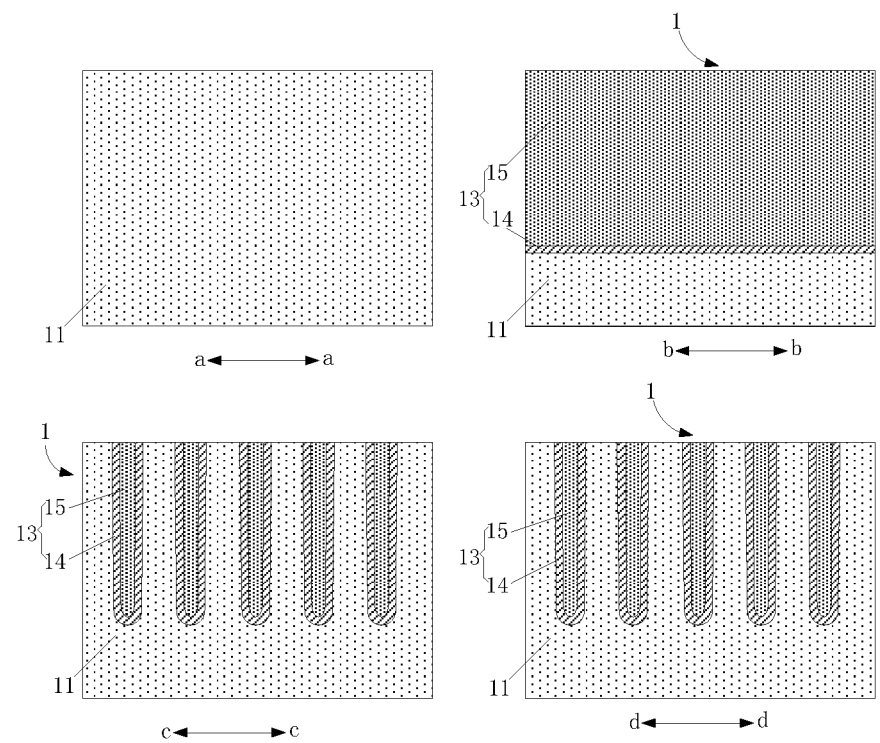

As shown in FIG. 2, a plurality of bit line isolation trenches 12 extending along the first direction are formed in the substrate 11. Specifically, the plurality of bit line isolation trenches 12 may be formed in the substrate 11 through a wet etching or dry etching process. The bit line isolation trenches 12 extend along the first direction and are spaced apart. Then, as shown in FIG. 3, a second sacrificial layer 14 may be formed in an inner wall surface of each bit line isolation trench 12 by a chemical vapor deposition process, a physical vapor deposition process or an atomic layer deposition process. The inner wall surface of the bit line isolation trench 12 refers to a sidewall and a bottom wall of the bit line isolation trench 12. That is, the second sacrificial layer 14 covers the sidewall and the bottom wall of the bit line isolation trench 12. Then, as shown in FIG. 4, a third sacrificial layer 15 is formed on a surface of the second sacrificial layer 14. The second sacrificial layer 14 and the third sacrificial layer 15 jointly form the isolation structure 13. The bit line isolation trench 12 is filled with the third sacrificial layer 15 and the second sacrificial layer 14. The second sacrificial layer 14 and the third sacrificial layer 15 have different etching selectivities, that is, the second sacrificial layer 14 and the third sacrificial layer 15 are made of different materials. The second sacrificial layer 14 and the third sacrificial layer have different etching rates. For example, the second sacrificial layer 14 and the third sacrificial layer 15 have a high etching selectivity, to facilitate subsequent selective etching. Therefore, it is unnecessary to use a new photomask for lithography, and the issue of overlay accuracy does not need to be considered, thereby improving the etching accuracy and simplifying the process. Optionally, the second sacrificial layer 14 may be an oxide layer, such as a silicon oxide layer. The third sacrificial layer 15 may be a spin-coated hard mask layer. In other embodiments of the present disclosure, the second sacrificial layer 14 and the third sacrificial layer 15 may be made of other materials, provided that the second sacrificial layer 14 and the third sacrificial layer 15 have a high selectivity to facilitate subsequent selective etching.

Step S2: Perform a patterned etching on the base 1 to form a plurality of word line isolation trenches 41 extending along a second direction, where the plurality of bit line isolation trenches 12 and the plurality of word line isolation trenches 41 form a plurality of semiconductor pillars 33 in the base 1.

Figure 5:
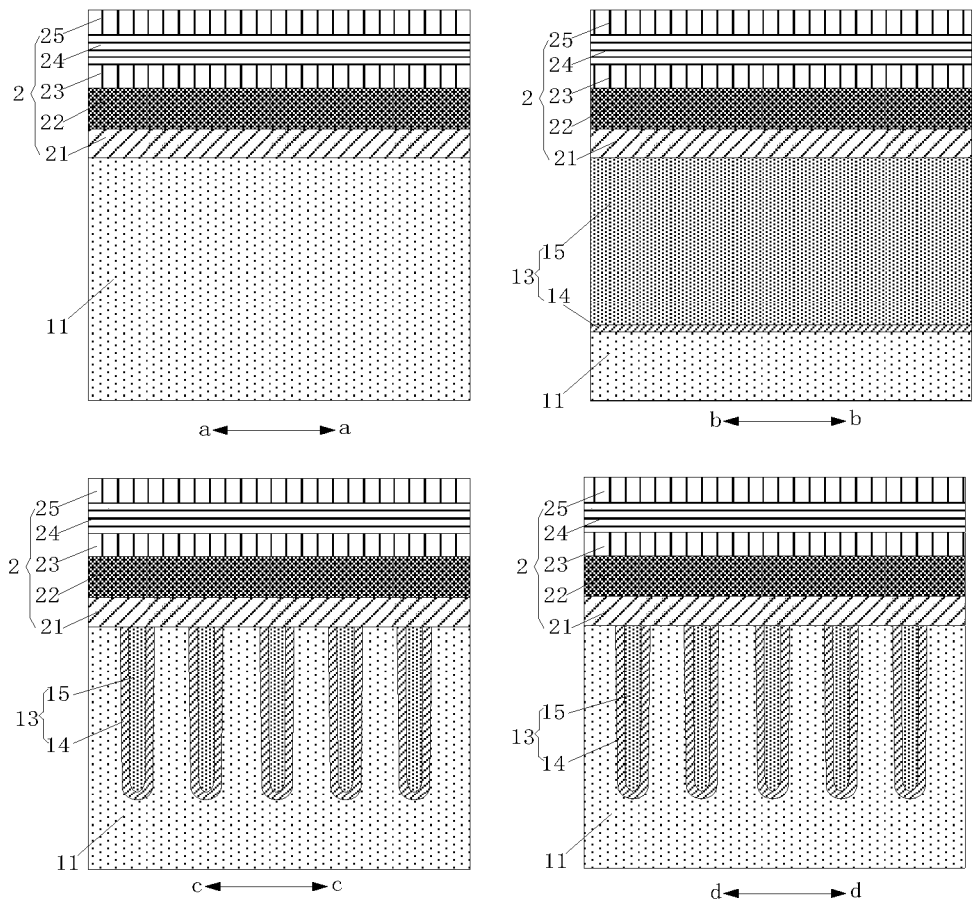

Specifically, as shown in FIG. 5, a mask layer structure 2 is formed on the surface of the base 1. The mask layer structure 2 includes a support mask layer 21 located on the surface of the base 1. Specifically, the mask layer structure 2 may be formed on the surface of the base 1 through deposition. The mask layer structure 2 may be a composite mask layer, to help form a semiconductor structure 100 with better appearance through subsequent etching. The mask layer structure 2 at least includes the support mask layer 21 located on the surface of the base 1. In some embodiments, the mask layer structure 2 may further include one or more of a hard carbon layer 22, a silicon oxynitride layer, or a spin-coated hard mask layer located on the support mask layer 21. For example, in the example shown in FIG. 5, the mask layer structure 2 includes a support mask layer 21, a hard carbon layer 22, a first oxynitride layer 23, a spin-coated hard mask layer 24, and a second oxynitride layer 25 sequentially arranged from top to bottom. The support mask layer 21 may be a silicon nitride layer; the first oxynitride layer 23 and the second oxynitride layer 25 may be silicon oxynitride layers.

Figure 6:
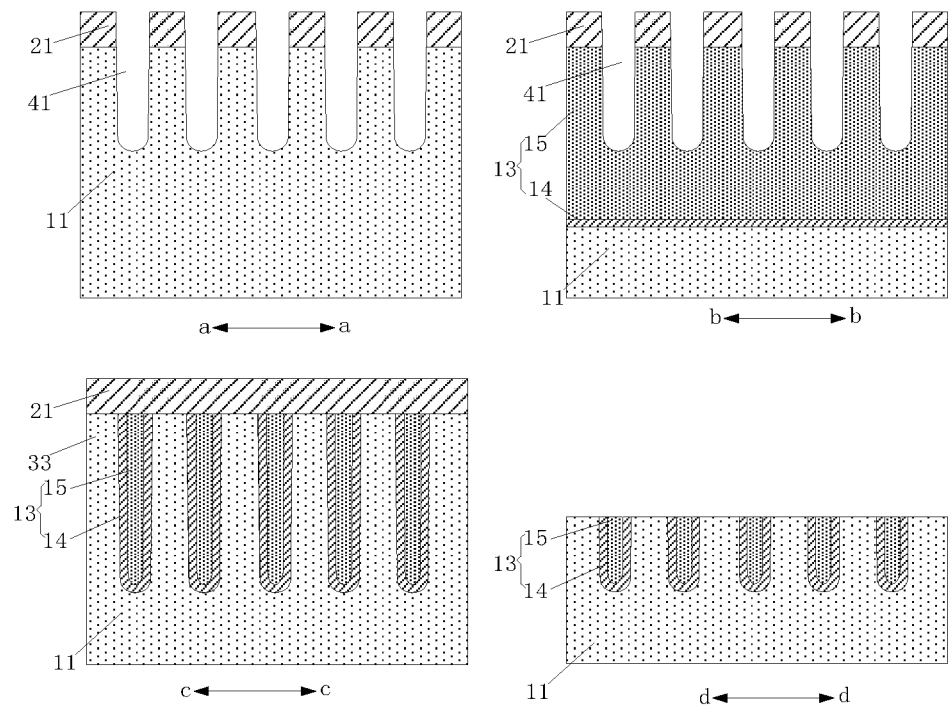

As shown in FIG. 6, the mask layer structure 2 is patterned, and the base 1 is etched to form a plurality of word line isolation trenches 41 extending along the second direction. A plurality of semiconductor pillars 33 are formed in the base 1. Specifically, a photoresist layer may be formed on the mask layer structure 2, and a pattern of the word line isolation trenches 41 is defined. Then, the base 1 is etched through a lithography process, to form the plurality of word line isolation trenches 41 in the base 1. The word line isolation trenches 41 extend along the second direction, where the first direction is perpendicular to the second direction. The word line isolation trenches 41 are perpendicular to the bit line isolation trenches 12, such that the word line isolation trenches 41 and the bit line isolation trenches 12 can form a plurality of semiconductor pillars 33 in the base 1, so as to form a plurality of active regions. As shown in FIG. 6, a depth of the word line isolation trench 41 is less than that of the bit line isolation trench 12, to facilitate forming the bit line metal layer 32 under the word line isolation trenches 41 subsequently.

As shown in FIG. 6, the mask layer structure 2 is partially removed, and the support mask layer 21 located on the surface of the base 1 is retained. That is, after the word line isolation trenches 41 are formed, the support mask layer 21 is retained during removal of the mask layer structure 2, so as to form word line gate layers 54 in the subsequent process. The support mask layer 21 may be used as a mask for forming the word line gate layers 54 in the subsequent process. In this way, there is no need to arrange a new photom ask or mask layer during forming of the word line gate layers 54, and the issue of overlay accuracy does not need to be considered.

As shown in FIG. 7 to FIG. 10, step S3: Form a bit line metal layer 32 on a surface of the semiconductor pillar 33 under the word line isolation trenches 41, the bit line metal layer 32 surrounding a sidewall of the semiconductor pillar 33.

In some embodiments of the present disclosure, the step of forming a bit line metal layer 32 may include:
partially etching the base 1 downward along the word line isolation trenches 41, to expose a part of the second sacrificial layer 14 located under the word line isolation trench 41;
etching to partially remove the second sacrificial layer 14, to expose partial sidewall of the semiconductor pillar 33 under the word line isolation trench 41; and
forming the bit line metal layer 32 on the sidewall of the semiconductor pillar 33.

Figure 7:
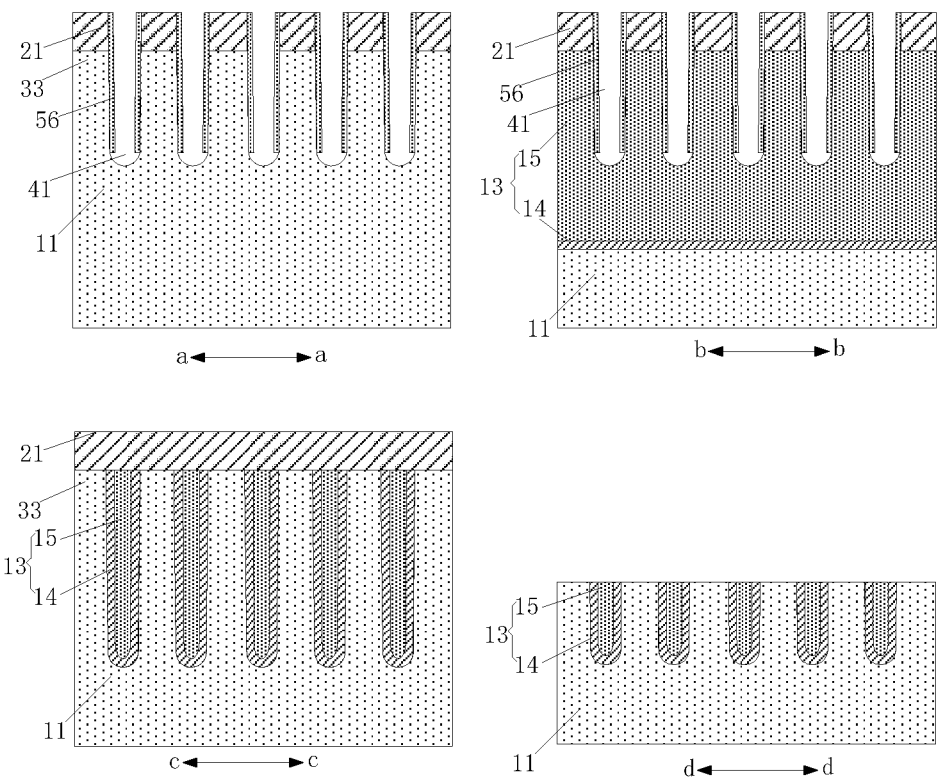

Specifically, before the base 1 is etched downward along the word line isolation trenches 41, a protective layer 56 may be formed on the sidewall of each word line isolation trench 41. As shown in FIG. 7, the protective layer 56 may be formed on the sidewall of each word line isolation trench 41 and on the sidewall of the support mask layer 21. As shown in FIG. 7, a material may be deposited on an inner wall surface of the word line isolation trench 41 and the surface of the support mask layer 21 by an atomic layer deposition process, and the material on the bottom wall of the word line isolation trench 41 and on the upper surface of the support mask layer 21 is removed through a back etching process, while only the material deposited on the sidewall of the word line isolation trench 41 and the sidewall of the support mask layer 21 is retained, to form the protective layer 56. As shown in a-a of FIG. 7, the protective layer 56 may be configured to protect the sidewalls of the semiconductor pillar 33 and the support mask layer 21 in the subsequent process, such that the sidewalls of the semiconductor pillar 33 and the support mask layer 21 are not etched, which avoids affecting the appearance of the semiconductor structure 100. As shown in a-a and d-d of FIG. 7, the bottom wall of the word line isolation trench 41 is not deposited with the protective layer 56, thus exposing the substrate 11, and also exposing partial second sacrificial layer 14 and third sacrificial layer 15 at the bottom of the word line isolation trench 41.

Figure 8:
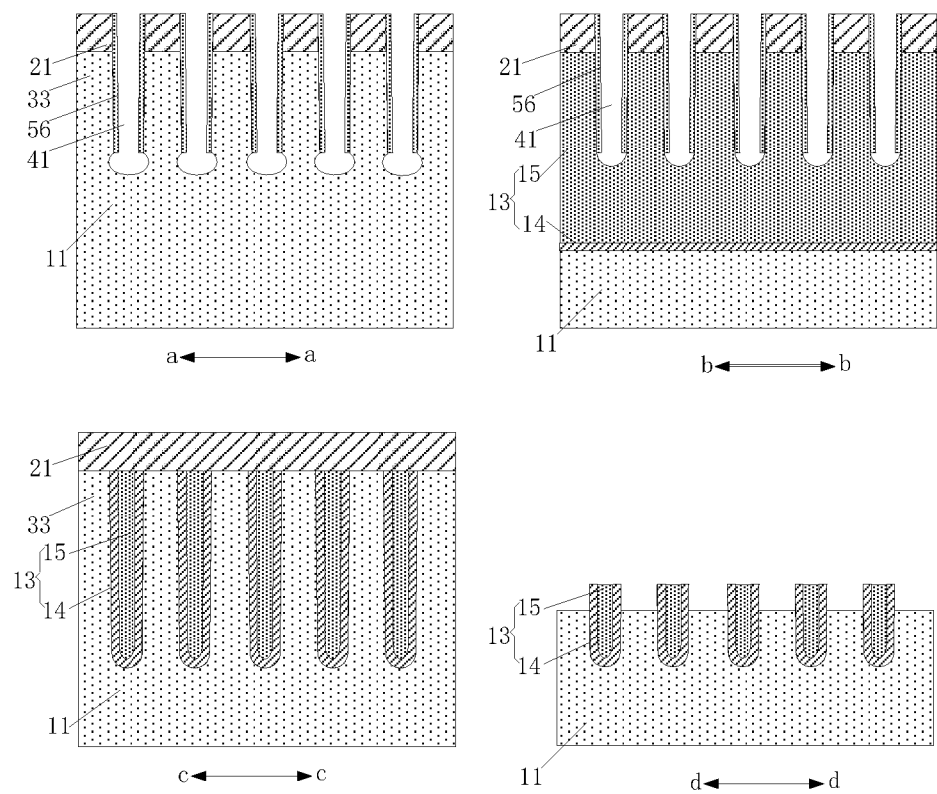

As shown in FIG. 8, the base 1 may be partially removed through downward etching along the word line isolation trenches 41. Specifically, an etching agent may be injected along the word line isolation trenches 41 to partially remove the substrate 11, thereby exposing partial second sacrificial layer 14 under the word line isolation trenches 41. Optionally, in this step, with reference to a-a and d-d of FIG. 8, a groove may be formed in the substrate 11 under the word line isolation trench 41 to expose the second sacrificial layer 14. In the example shown in FIG. 8, the groove can be formed as a large bowl-shaped structure or oval structure, etc., thereby increasing the exposed area of the second sacrificial layer 14 to facilitate subsequent etching of the second sacrificial layer 14. In this step, the protective layer 56 can protect the sidewalls of the semiconductor pillar 33 and the support mask layer 21, which form the word line isolation trench 41, from being etched, such that the etching agent can etch downward the substrate 11 under the word line isolation trench 41 along the word line isolation trench 41.

Figure 9:
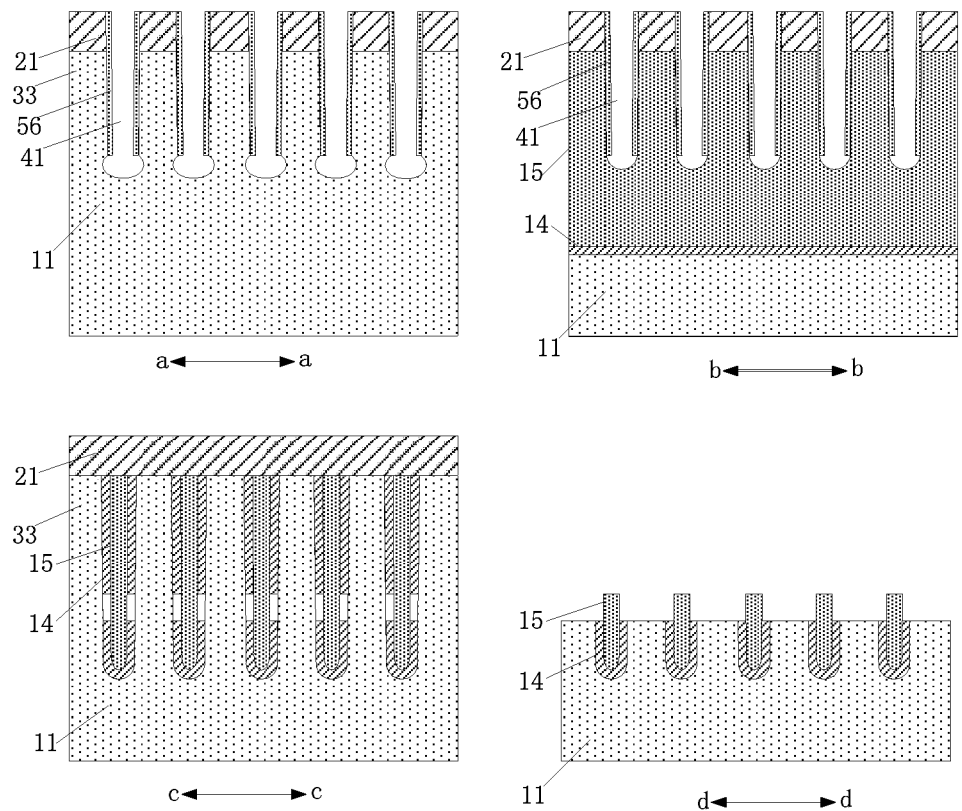

As shown in FIG. 9, next, the etching agent can be injected along the word line isolation trench 41 to partially remove the second sacrificial layer 14 through etching, so as to expose the sidewall of the semiconductor pillar 33 under the word line isolation trench 41. In this way, as shown in a-a, b-b, and c-c of FIG. 9, the sidewall, which forms the bit line isolation trench 12, of partial semiconductor pillar 33 under the word line isolation trench 41 is exposed. In addition, the base 1 is etched along the word line isolation trench 41 such that partial sidewall of the semiconductor pillar 33 under the word line isolation trench 41 is exposed. In this way, all the peripheral sidewall of the partial semiconductor pillar 33 under the word line isolation trench 41 is exposed. In this step, the protective layer 56 and the second sacrificial layer 14 may have a high etching selectivity. Optionally, a material of the protective layer 56 may be the same as that of the third sacrificial layer 15 to better protect the sidewall of the semiconductor pillar 33 的 sidewall. The protective layer 56 can also be etched when the third sacrificial layer 15 is etched subsequently, thereby simplifying process steps.

Figure 10:
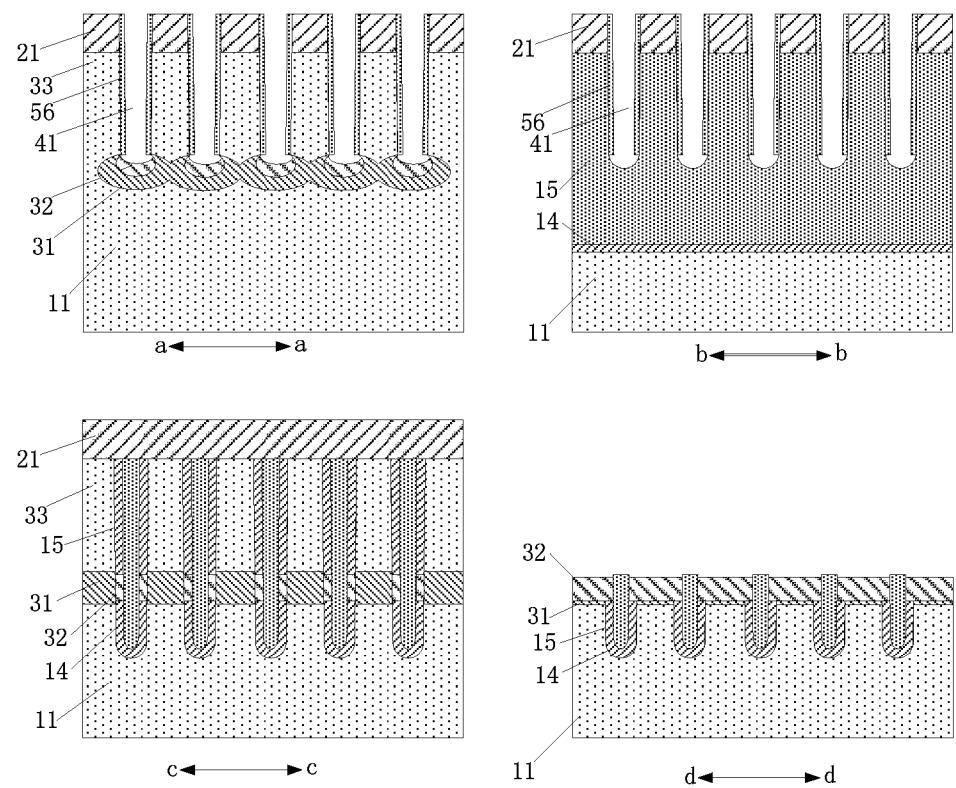

As shown in FIG. 10, a metal material may be deposited along the word line isolation trench 41 to form the bit line metal layer 32 on the surface of the exposed semiconductor pillar 33, thereby forming the bit line metal layer 32 surrounding the semiconductor pillar 33.

In some embodiments, the metal material may be deposited directly to form the bit line metal layer 32 on the peripheral sidewall of the semiconductor pillar 33. In other embodiments of the present disclosure, before the bit line metal layer 32 is formed through deposition, a metal silicide layer 31 may be formed on the surface of the semiconductor pillar 33, and then the bit line metal layer 32 is deposited on the surface of the metal silicide layer 31. The metal silicide layer 31 can reduce the contact resistance and improve the performance of the semiconductor structure 100. The metal silicide layer 31 may be made of cobalt silicide, titanium silicide, tungsten silicide, etc., and the bit line metal layer 32 may be made of tungsten, nickel, titanium, titanium nitride, molybdenum, etc. In some examples, the metal silicide layer 31 may be formed by depositing a metal material on the surface of the semiconductor pillar 33 and using a rapid thermal process. For example, a material such as cobalt, tungsten, nickel, titanium, or molybdenum, which can react with the silicon substrate 11, may be deposited on the surface of semiconductor pillar 33, and then a tungsten metal silicide is formed by a rapid thermal process. Alternatively, the metal silicide layer 31 may be formed by depositing a metal silicide material directly on the surface of the semiconductor pillar 33 through a chemical vapor deposition process.

In some embodiments of the present disclosure, the step of forming a bit line metal layer 32 on a surface of the semiconductor pillar 33 may include: forming an initial bit line metal layer on the surface of each exposed semiconductor pillar 33 and in the word line isolation trench 41; etching to partially remove the initial bit line metal layer located in the word line isolation trench 41, such that an upper surface of the initial bit line metal layer located in the word line isolation trench 41 is not higher than an upper surface of the third sacrificial layer 15, to form the bit line metal layer 32.

Specifically, a metal material may be deposited along the word line isolation trench 41. The metal material is deposited on the sidewall of the semiconductor pillar 33 from which the second sacrificial layer 14 has been partially removed and on the inner wall surface of the word line isolation trench 41, to form an initial bit line metal layer. The initial bit line metal layer at least covers partial sidewall and the bottom wall of the word line isolation trench 41. The initial bit line metal layer located in the word line isolation trench 41 is partially etched back, as shown in d-d of FIG. 10, such that the upper surface of the initial bit line metal layer is not higher than the third sacrificial layer 15 at the bottom of the word line isolation trench 41, to form the bit line metal layer 32, thereby preventing contact and connection between the bit line metal layers 32. Further, in the example shown in d-d of FIG. 10, the upper surface of the bit line metal layer 32 is lower than the upper surface of the third sacrificial layer 15 at the bottom of the word line isolation trench 41, thereby further preventing connection between the bit line metal layer 32 through the back etching process.

Figure 11:
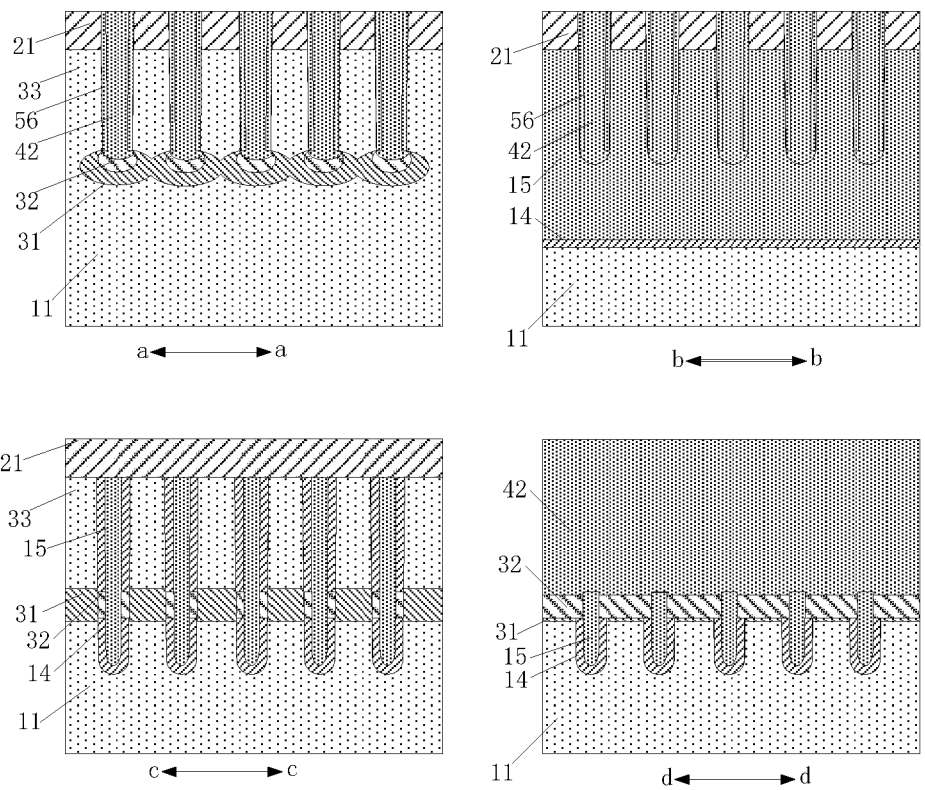

As shown in FIG. 11, the forming method of the semiconductor structure 100 further includes: forming a first sacrificial layer 43 in the word line isolation trench 41 and on the bit line metal layer 32. Specifically, the first sacrificial layer 43 may be formed by one or more of a chemical vapor deposition process, a physical vapor deposition process, or an atomic layer deposition process. The word line isolation trench 41 is filled with the first sacrificial layer 43, and the first sacrificial layer 43 is formed on the bit line metal layer 32, such that the subsequently formed word line gate layer 54 is isolated from the bit line metal layer 32. Optionally, a material of the first sacrificial layer 43 may be the same as that of the third sacrificial layer 15 and the protective layer 56. For example, the first sacrificial layer 43, the third sacrificial layer 15, and the protective layer 56 are all made of a spin-coated hard mask material, to facilitate subsequent etching of sacrificial layers to expose the semiconductor pillar 33.

Figure 12:
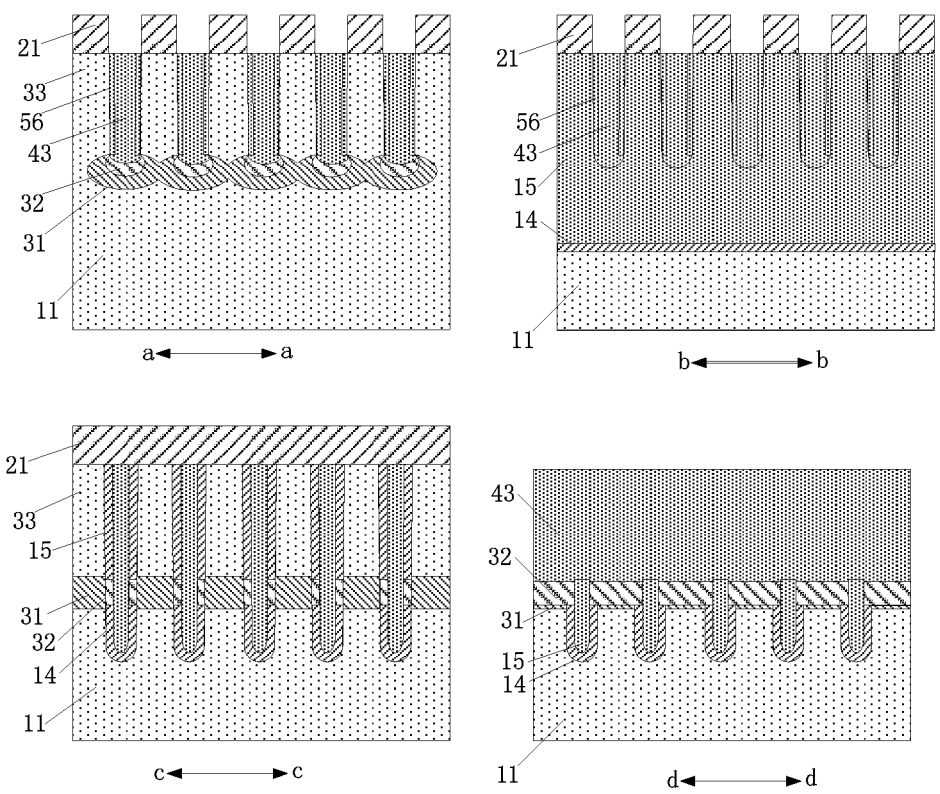

In some embodiments, the step of forming a first sacrificial layer 43 may include: as shown in FIG. 11, forming an first initial sacrificial layer 42 in the word line isolation trench 41 and on the surface of the support mask layer 21, where the first initial sacrificial layer 42 can fill up the word line isolation trench 41 and an opening, which corresponds to the word line isolation trench 41, in the support mask layer 21; then, as shown in FIG. 12, partially removing the first initial sacrificial layer 42 located on the surface of the support mask layer 21, that is, etching back to partially remove the first initial sacrificial layer 42 located in the opening of the support mask layer 21 and only retaining the first initial sacrificial layer 42 located in the word line isolation trench 41 to form the first sacrificial layer 43, where the word line isolation trench 41 is filled with the first sacrificial layer 43. In this step, the material of the protective layer 56 may be the same as that of the first sacrificial layer 43. In this way, while the first sacrificial layer 43 located on the surface of the support mask layer 21 is removed, the protective layer 56 formed on the surface of the support mask layer 21 can also be removed to expose the sidewall of the support mask layer 21.

Figure 13:
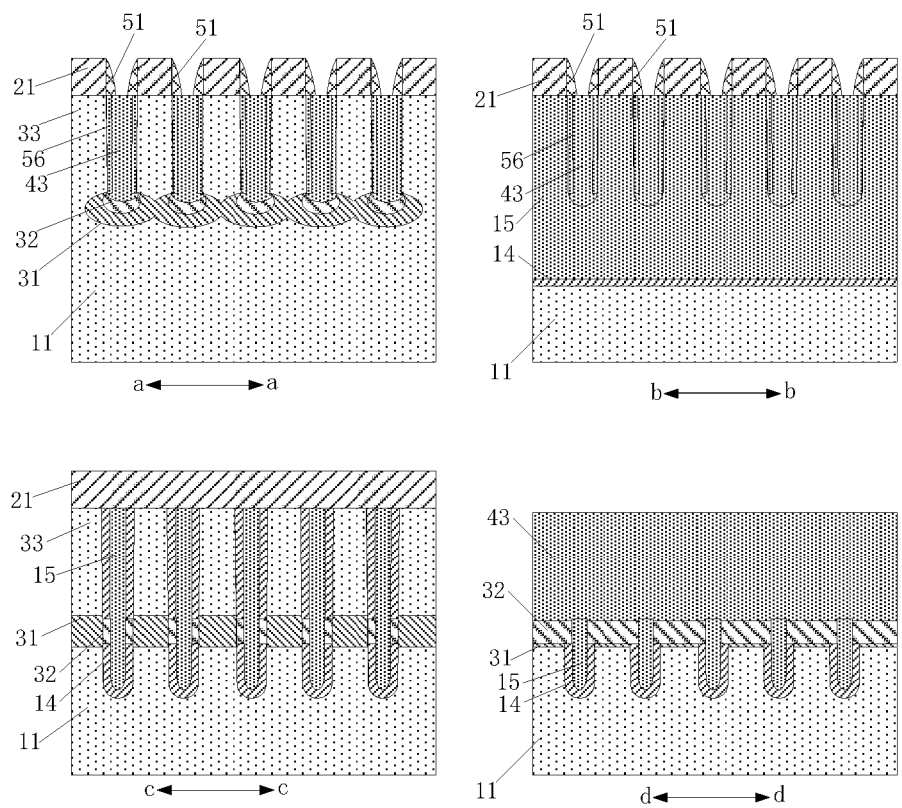

As shown in FIG. 13, side walls are formed on sidewalls of the support mask layer 21, where an opening exposing the first sacrificial layer 43 is formed between adjacent side walls 51. Specifically, a nitride material may be deposited on the surface of the first sacrificial layer 43 and the surface of the support mask layer 21 by an atomic layer deposition process, and then the nitride material is etched back. Due to the geometric effect of the sidewall, the nitride material deposited on the sidewall of the support mask layer 21 will be retained to form the side wall 51. The side wall 51 and the support mask layer 21 may be used as a mask layer in the subsequent process of forming the word line gate layer 54. Therefore, it is unnecessary to arrange a new photomask.

Figure 14:
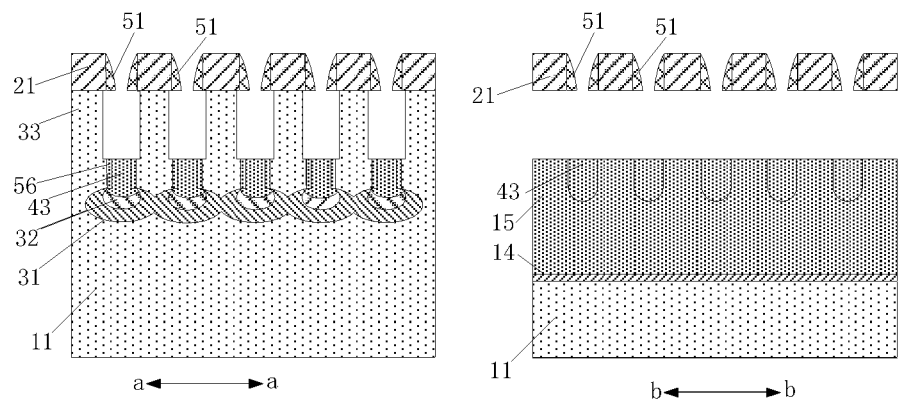
Figure 14:
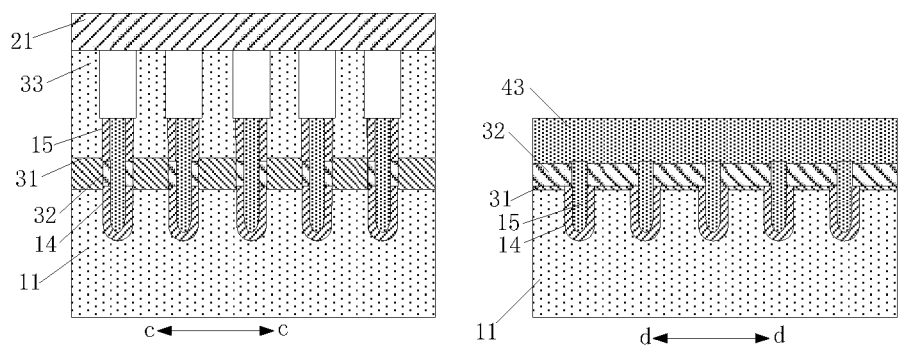

As shown in FIG. 14, the first sacrificial layer 43 may be partially removed along the opening between the side walls 51, to expose the semiconductor pillar 33. Specifically, an etching agent may be injected along the opening between the side walls 51, to etch the first sacrificial layer 43 through a wet etching process, thereby partially removing the first sacrificial layer 43 to expose the semiconductor pillar 33, where the first sacrificial layer 43 may be partially removed to a position where the bit line metal layer 32 is not exposed. That is, partial first sacrificial layer 43 above the bit line metal layer 32 is retained to isolate the subsequently formed word line gate layer 54 from the bit line metal layer 32. In this step, the protective layer 56 located on the sidewall of the semiconductor pillar 33 may be partially removed at the same time, to expose the sidewall of the semiconductor pillar 33.

In some examples, as shown in c-c of FIG. 14, the isolation structure 13 located in the bit line isolation trench 12 may also be partially removed, such that the sidewall for forming the bit line isolation trench 12 and the sidewall for forming the word line isolation trench 41 of the semiconductor pillar 33 are both exposed, that is, all the peripheral sidewall of the semiconductor pillar 33 is exposed, to facilitate forming the word line gate layer 54 surrounding the semiconductor pillar 33 subsequently. Specifically, the material of the first sacrificial layer 43 may be the same as that of the third sacrificial layer 15. During partial removal of the first sacrificial layer 43 through back etching, the third sacrificial layer 15 can also be partially removed, and then the second sacrificial layer 14 is partially removed through etching to expose the sidewall of the semiconductor pillar 33.

In some embodiments, after the first sacrificial layer 43 is partially removed, the semiconductor pillar 33 may be oxidized such that a cross-sectional area of an exposed part of the semiconductor pillar 33 is smaller than a cross-sectional area of an unexposed part of the semiconductor pillar 33. That is, the semiconductor pillar 33 can be thinned after being oxidized.

Figure 15:
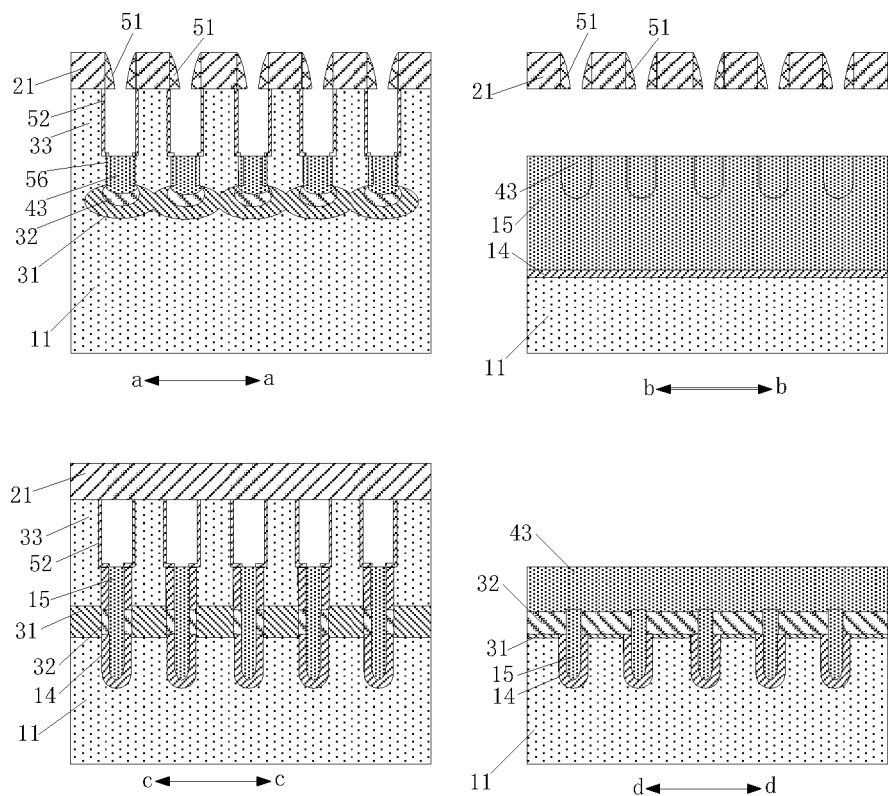

As shown in FIG. 15, a word line gate dielectric layer 52 is formed on the surface of the exposed semiconductor pillar 33. The word line gate dielectric layer 52 may be an oxide layer. Specifically, a silicon oxide layer is grown on the surface of the semiconductor pillar 33 to form the word line gate dielectric layer 52. The word line gate dielectric layer 52 covers the surface of the exposed semiconductor pillar 33. As shown in a-a and c-c of FIG. 15, the word line gate dielectric layer 52 is connected to the second sacrificial layer 14 and is formed on the surface of the semiconductor pillar 33. The support mask layer 21 and the side wall 51 are supported by the semiconductor pillar 33.

Figure 16:
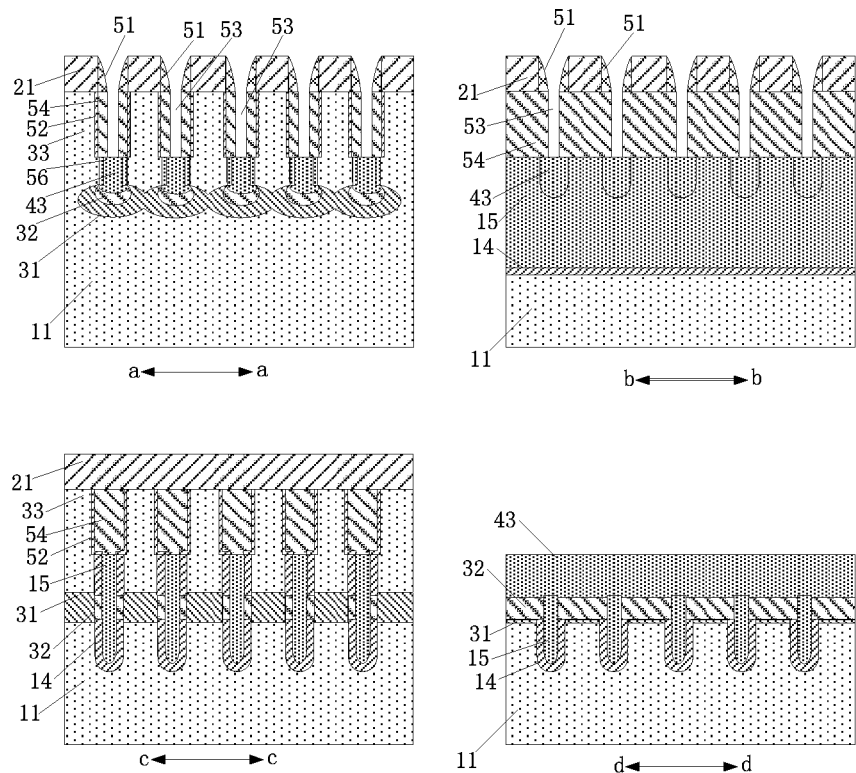

After the word line gate dielectric layer 52 is formed, the following steps may be performed: forming an initial word line gate layer on a surface of the word line gate dielectric layer 52, where the initial word line gate layer is located on the surface of the word line gate dielectric layer and fills up the word line isolation trench 41; then as shown in FIG. 16, etching the initial word line gate layer by the support mask layer 21 and the side walls 51 as a mask to form word line gate layers 54, where a word line isolation opening 53 is formed between adjacent word line gate layers 54.

Specifically, a metal material may be deposited on the surface of the word line gate dielectric layer 52, the support mask layer 21, and the surfaces of the side walls 51. The metal material has a thickness of 10-40 nm or above on the support mask layer 21, and then the metal material is wet-etched to reach the surface of the support mask layer 21. That is, the metal material on the upper surface of the support mask layer 21 may be removed through a wet etching process, to form the initial word line gate layer. Then, the initial word line gate layer is etched by the support mask layer 21 and the side walls 51 as a mask. In this step, the initial word line gate layer may be etched by a dry etching process, to form the word line gate layer 54 covering the surface of the word line gate dielectric layer 52 and form the word line isolation opening 53 between adjacent word line gate layers 54. Then, step S12 is performed: removing the support mask layer 21 and the side walls 51.

Figure 17:
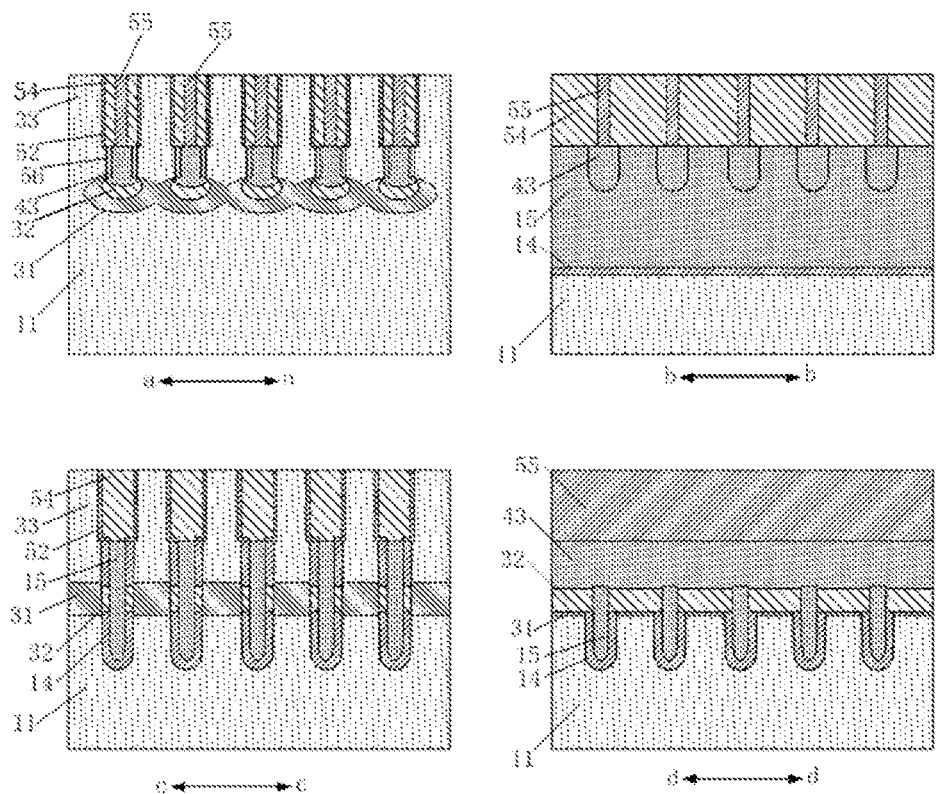

As shown in FIG. 17, a word line isolation layer 55 is formed in the word line isolation opening 53. The word line isolation opening 53 between the word line gate layers 54 is filled with the word line isolation layer 55. Specifically, an initial word line isolation layer may be formed on the surface of the semiconductor pillar 33, the surface of the word line gate dielectric layer 52, and the surface of the word line gate layer 54 by one or more of a chemical vapor deposition process, a physical vapor deposition process, or an atomic layer deposition process. Then, the initial word line isolation layer on the upper surface of the semiconductor pillar 33, the upper surface of the word line gate dielectric layer 52, and the upper surface of the word line gate layer 54 is partially removed, while only the initial word line isolation layer on the sidewall of the word line gate layer 54 is retained to form the word line isolation layer 55. In this step, the initial word line isolation layer may be partially removed by a planarization process such as chemical mechanical polishing and an etching process.

Figure 18:
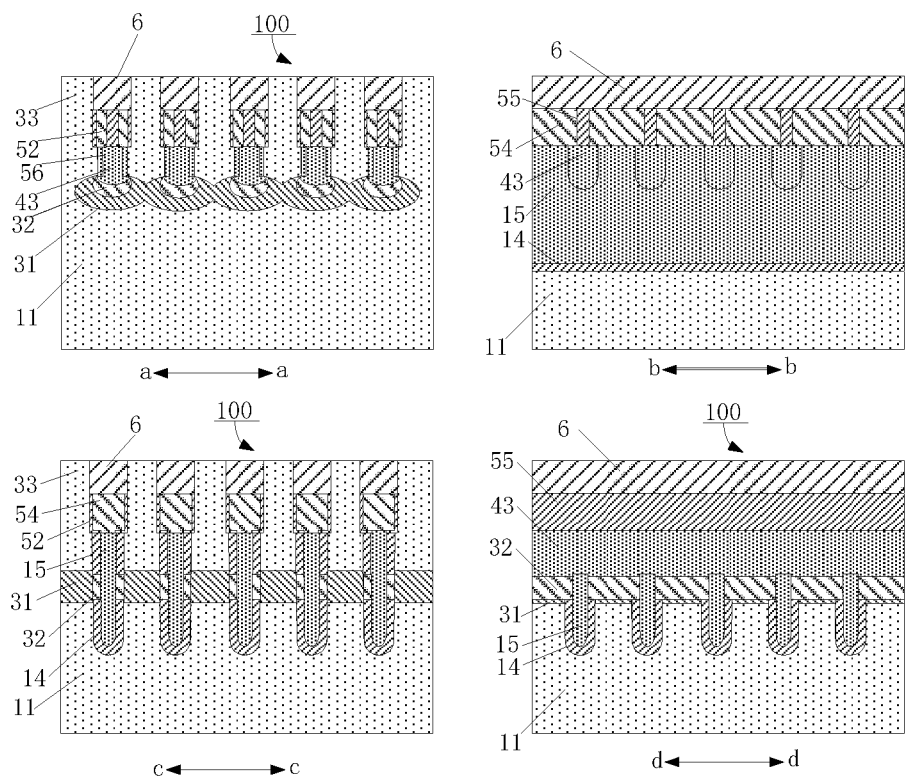

In some embodiments of the present disclosure, as shown in FIG. 18, the forming method of the semiconductor structure 100 may further include etching back the word line gate dielectric layer 52, the word line gate layer 54, and the word line isolation layer to form a support groove, and forming a support layer 6 in the support groove. Specifically, the word line gate layer 54, the word line gate dielectric layer 52, and the word line isolation layer 55 between the semiconductor pillars 33 may be etched back to form a support groove between the semiconductor pillars 33. A depth of the support groove may be specified according to actual needs. Then, a support material is deposited in the support groove and on the surface of the semiconductor pillar 33. The support material above the semiconductor pillar 33 is removed, and only the support material between the semiconductors pillar 33 is retained to form the support layer 6. The support layer 6 may be connected to a plurality of semiconductor pillars 33 to support the semiconductor pillars 33. In this step, the support material above the semiconductor pillar 33 may be removed through chemical mechanical polishing and etching. Optionally, the support layer 6 may be a nitride layer or an oxynitride layer. For example, the support layer 6 may be a silicon nitride layer or a silicon oxynitride layer, which is not specifically limited in the present disclosure.

In some embodiments of the present disclosure, the forming method of the semiconductor structure 100 further includes implanting ions to the base 1 to form sources and drains, where an implantation depth of the drain is 160 nm to 170 nm. In this way, a position of the drain corresponds to the position of the bit line metal layer 32, such that the bit line metal layer 32 is connected to the drain. Specifically, ions may be implanted to the substrate 11 to form P-well regions, N-well regions, sources, and drains, where phosphorus or arsenic ions may be implanted at a depth of 160 nm to 170 nm in the substrate 11 to form the drains, which facilitates connection between the drain and the bit line metal layer 32, thereby reducing the resistance of the bit line metal layer 32.

The present disclosure further provides semiconductor structure 100. The semiconductor structure 100 is prepared by the forming method of a semiconductor structure 100 according to the foregoing embodiment.

The semiconductor structure 100 according to an embodiment of the present disclosure includes: a base 1 and bit line metal layers. The base 1 is provided with a plurality of bit line isolation trenches 12 extending along a first direction, an isolation structure 13 each located in the bit line isolation trench 12, and a plurality of word line isolation trenches 41 extending along a second direction. The plurality of bit line isolation trenches 12 and the plurality of word line isolation trenches 41 form a plurality of semiconductor pillars 33 in the base 1. The bit line metal layer 32 is located on a surface of the semiconductor pillar 33 under the word line isolation trench 41, and the bit line metal layer 32 surrounds a sidewall of the semiconductor pillar 33.

Therefore, in the semiconductor structure 100 and the forming method thereof according to the embodiments of the present disclosure, the bit line metal layer 32 is formed on the surface of the semiconductor pillar 33 under the word line isolation trench 41, and the bit line metal layer 32 surrounds the sidewall of the semiconductor pillar 33, thereby enhancing control over channels, reducing leakage, improving carrier mobility, and improving the performance of the semiconductor structure 100. The bit line metal layer 32 is formed by etching the second sacrificial layer 14 and the third sacrificial layer with different etching selectivities. Therefore, it is unnecessary to arrange a new photomask, thereby simplifying the process and reducing cost of the semiconductor structure, and the issue of overlay accuracy does not need to be considered.

Further, the retained support mask layer 21 and the subsequently formed side walls 51 are used as a mask for forming the word line gate layer 54 subsequently. Therefore, the word line gate layer 54 can be formed without arranging a new photomask, thereby simplifying the process and reducing the cost of the semiconductor structure 100. In addition, the issue of overlay accuracy does not need to be considered.

Further, in the process of forming the bit line metal layer 32, the bit line isolation trench 12 is filled with the second sacrificial layer 14 and the third sacrificial layer 15, and a bowl-shaped groove is formed. Based on the high etching selectivity of the second sacrificial layer 14 and the third sacrificial layer 15, the second sacrificial layer 14 is partially removed to form the bit line metal layer 32 surrounding the sidewall of the semiconductor pillar 33, thereby reducing the resistance between the bit line metal layers 32.

Described above are merely preferred implementations of the present disclosure. It should be noted that several improvements and modifications may further be made by a person of ordinary skill in the art without departing from the principle of the present disclosure, and such improvements and modifications should also be deemed as falling within the protection scope of the present disclosure.

The invention claimed is:

1. A forming method of a semiconductor structure, comprising:
   providing a base, wherein the base is provided with a plurality of bit line isolation trenches extending along a first direction and an isolation structure located in the bit line isolation trench;
   performing a patterned etching on the base to form a plurality of word line isolation trenches extending along a second direction, wherein the plurality of bit line isolation trenches and the plurality of word line isolation trenches form a plurality of semiconductor pillars in the base; and
   forming a bit line metal layer on a surface of the semiconductor pillar under the word line isolation trench, the bit line metal layer surrounding a sidewall of the semiconductor pillar;
   forming a first sacrificial layer in the word line isolation trench and on the bit line metal layer;
   partially removing the first sacrificial layer to expose the semiconductor pillar; and
   forming a word line gate structure on a surface of the exposed semiconductor pillar, wherein the word line gate structure surrounds the sidewall of the semiconductor pillar;
   wherein
   the performing a patterned etching on the base to form a plurality of word line isolation trenches extending along a second direction, a mask layer structure is formed on the base, and the mask layer structure is partially retained after the word line isolation trenches are formed, to form a support mask layer, wherein the support mask layer exposes the word line isolation trench;
   the partially removing the first sacrificial layer to expose the semiconductor pillar comprises:
   forming side walls on sidewalls of the support mask layer, wherein an opening exposing the first sacrificial layer is formed between adjacent side walls; and
   partially removing the first sacrificial layer along the opening between the side walls; and
   the forming a word line gate structure comprises:
   forming a word line gate dielectric layer on the surface of the exposed semiconductor pillar;
   forming an initial word line gate layer on a surface of the word line gate dielectric layer;
   etching the initial word line gate layer by the support mask layer and the side walls as a mask to form word line gate layers, wherein a word line isolation opening is formed between adjacent word line gate layers, and the word line gate layer and the word line gate dielectric layer jointly form the word line gate structure; and
   removing the support mask layer and the side walls.

2. The forming method of a semiconductor structure according to claim 1, wherein
after the forming a word line gate structure on a surface of the exposed semiconductor pillar, the method further comprises:
forming a word line isolation layer in the word line isolation opening.

3. The forming method of a semiconductor structure according to claim 1, wherein
forming the base comprise:
providing a substrate;
forming the plurality of bit line isolation trenches extending along the first direction in the substrate;
forming a second sacrificial layer on an inner wall surface of the bit line isolation trench; and
forming a third sacrificial layer on a surface of the second sacrificial layer, wherein the second sacrificial layer and the third sacrificial layer jointly form the isolation structure, and an etching selectivity of the second sacrificial layer is different from that of the third sacrificial layer.

4. The forming method of a semiconductor structure according to claim 3, wherein the forming a bit line metal layer on a surface of the semiconductor pillar under the word line isolation trench, the bit line metal layer surrounding a sidewall of the semiconductor pillar comprises:
partially etching the base downward along the word line isolation trenches, to expose a part of the second sacrificial layer located under the word line isolation trench;
etching to partially remove the second sacrificial layer, to expose partial sidewall of the semiconductor pillar under the word line isolation trench; and
forming the bit line metal layer on the sidewall of the semiconductor pillar.

5. The forming method of a semiconductor structure according to claim 4, wherein before the partially etching the base downward along the word line isolation trenches, the method further comprises: forming a protective layer on a sidewall of the word line isolation trench.

6. The forming method of a semiconductor structure according to claim 4, wherein before the forming a bit line metal layer on a surface of the semiconductor pillar, the method further comprises: forming a metal silicide layer on the surface of the semiconductor pillar, the bit line metal layer being formed on a surface of the metal silicide layer.

7. The forming method of a semiconductor structure according to claim 4, wherein the forming a bit line metal layer on a surface of the semiconductor pillar comprises:
forming an initial bit line metal layer on the surface of the exposed semiconductor pillar and in the word line isolation trench; and
etching to partially remove the initial bit line metal layer located in the word line isolation trench, such that an upper surface of the initial bit line metal layer located in the word line isolation trench is not higher than an upper surface of the third sacrificial layer, to form the bit line metal layer.

8. The forming method of a semiconductor structure according to claim 7, wherein the upper surface of the bit line metal layer is lower than the upper surface of the third sacrificial layer at a bottom of the word line isolation trench.

9. The forming method of a semiconductor structure according to claim 5, wherein the forming a first sacrificial layer in the word line isolation trench and on the bit line metal layer comprises:
forming a first initial sacrificial layer in the word line isolation trench and on a surface of the support mask layer; and
partially removing the first initial sacrificial layer on the surface of the support mask layer, and retaining the first initial sacrificial layer in the word line isolation trench to form the first sacrificial layer.

10. The forming method of a semiconductor structure according to claim 9, wherein a material of the first sacrificial layer is the same as that of the protective layer; during the partially removing the first initial sacrificial layer on the surface of the support mask layer, the protective layer on the sidewall of the support mask layer is also partially removed; and during the partially removing the first sacrificial layer along the opening between the side walls, the protective layer on the sidewall of the semiconductor pillar is also removed to expose the semiconductor pillar.

11. The forming method of a semiconductor structure according to claim 1, wherein
after the partially removing the first sacrificial layer along the opening between the side walls, the method further comprises: oxidizing the semiconductor pillar such that a cross-sectional area of an exposed part of the semiconductor pillar is smaller than a cross-sectional area of an unexposed part of the semiconductor pillar.

12. The forming method of a semiconductor structure according to claim 2, wherein after the forming a word line isolation layer in the word line isolation opening, the method further comprises:
etching back the word line gate dielectric layer, the word line gate layer, and the word line isolation layer to form a support groove; and
forming a support layer in the support groove.

* * * * *